United States Patent
Takahashi et al.

(10) Patent No.: US 8,450,734 B2
(45) Date of Patent: May 28, 2013

(54) SEMICONDUCTOR DEVICE AND FABRICATION METHOD FOR THE SAME

(75) Inventors: Masao Takahashi, Kyoto (JP); Noriyuki Nagai, Nara (JP)

(73) Assignee: Panasonic Corporation, Osaka (JP)

( * ) Notice: Subject to any disclaimer, the term of this patent is extended or adjusted under 35 U.S.C. 154(b) by 265 days.

(21) Appl. No.: 12/713,724

(22) Filed: Feb. 26, 2010

(65) Prior Publication Data

US 2010/0148173 A1  Jun. 17, 2010

Related U.S. Application Data

(63) Continuation of application No. PCT/JP2009/002695, filed on Jun. 15, 2009.

(30) Foreign Application Priority Data

Sep. 17, 2008 (JP) ................................ 2008-237914
Sep. 24, 2008 (JP) ................................ 2008-244856

(51) Int. Cl.
*H01L 23/525* (2006.01)
(52) U.S. Cl.
USPC 257/48; 257/200; 257/E23.146; 257/E23.149
(58) Field of Classification Search
USPC .................... 257/48, 200, E23.146, 149
See application file for complete search history.

(56) References Cited

U.S. PATENT DOCUMENTS

| | | | |
|---|---|---|---|
| 5,444,366 A * | 8/1995 | Chiu | 324/750.05 |
| 5,739,546 A | 4/1998 | Saitou et al. | |
| 5,897,193 A | 4/1999 | Nishino | |
| 6,133,054 A | 10/2000 | Henson | |
| 6,410,936 B1 | 6/2002 | Hongo | |
| 7,071,487 B2 | 7/2006 | Maruyama | |
| 2003/0124816 A1* | 7/2003 | Potts | 438/462 |
| 2003/0205737 A1* | 11/2003 | Fenner et al. | 257/200 |
| 2006/0156136 A1* | 7/2006 | McBride | 714/736 |

FOREIGN PATENT DOCUMENTS

| | | |
|---|---|---|
| JP | 2001-093949 | 4/2001 |
| JP | 2003-303837 | 10/2003 |
| JP | 2005-101439 | 4/2005 |
| JP | 2008-108988 | 5/2008 |
| JP | 2008-198707 | 8/2008 |

\* cited by examiner

*Primary Examiner* — Minchul Yang
(74) *Attorney, Agent, or Firm* — McDermott Will & Emery LLP

(57) ABSTRACT

A semiconductor device includes: a semiconductor element (1) having an internal circuit (17); and electrode pads (22, 22, . . . ) provided for the semiconductor element (1). The electrode pads (22, 22, . . . ) are electrically connected to the internal circuit (17) via control portions (31) for controlling electrical connection between the electrode pads (22, 22, . . . ) and the internal circuit (17).

8 Claims, 13 Drawing Sheets

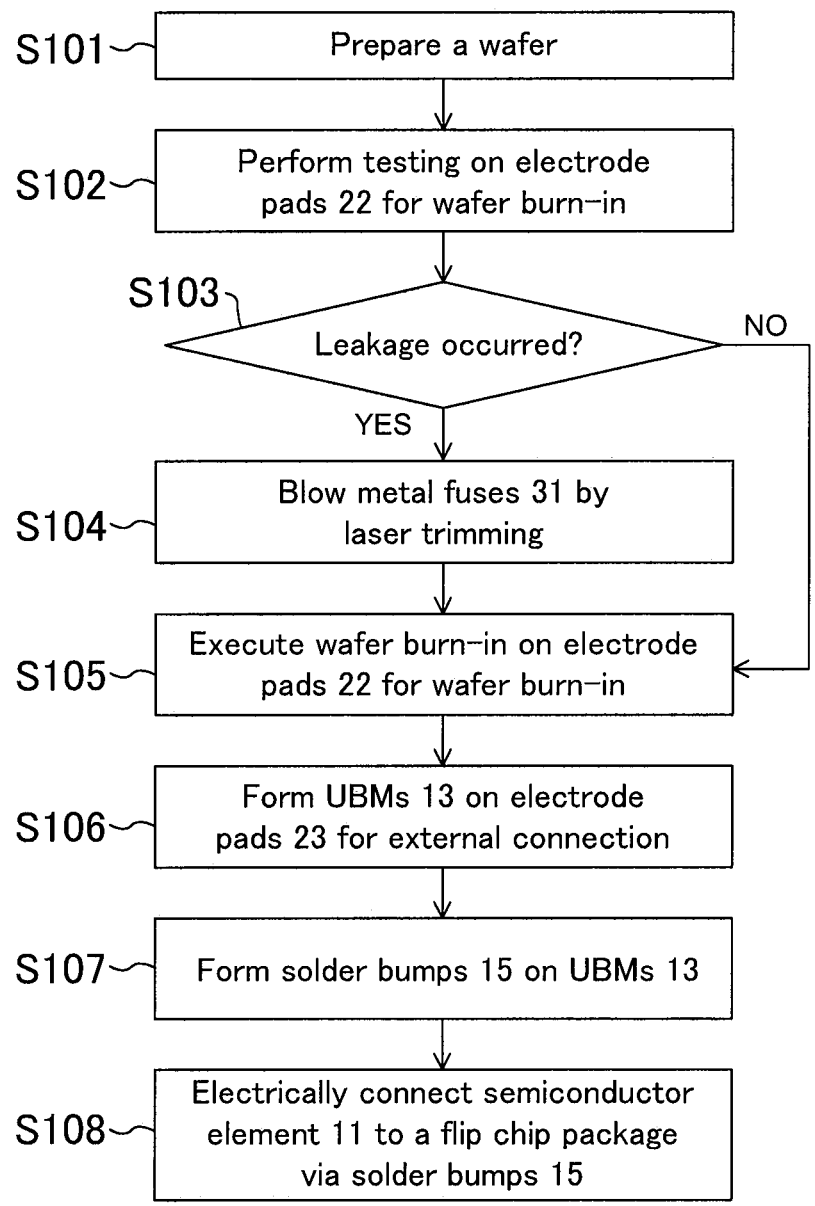

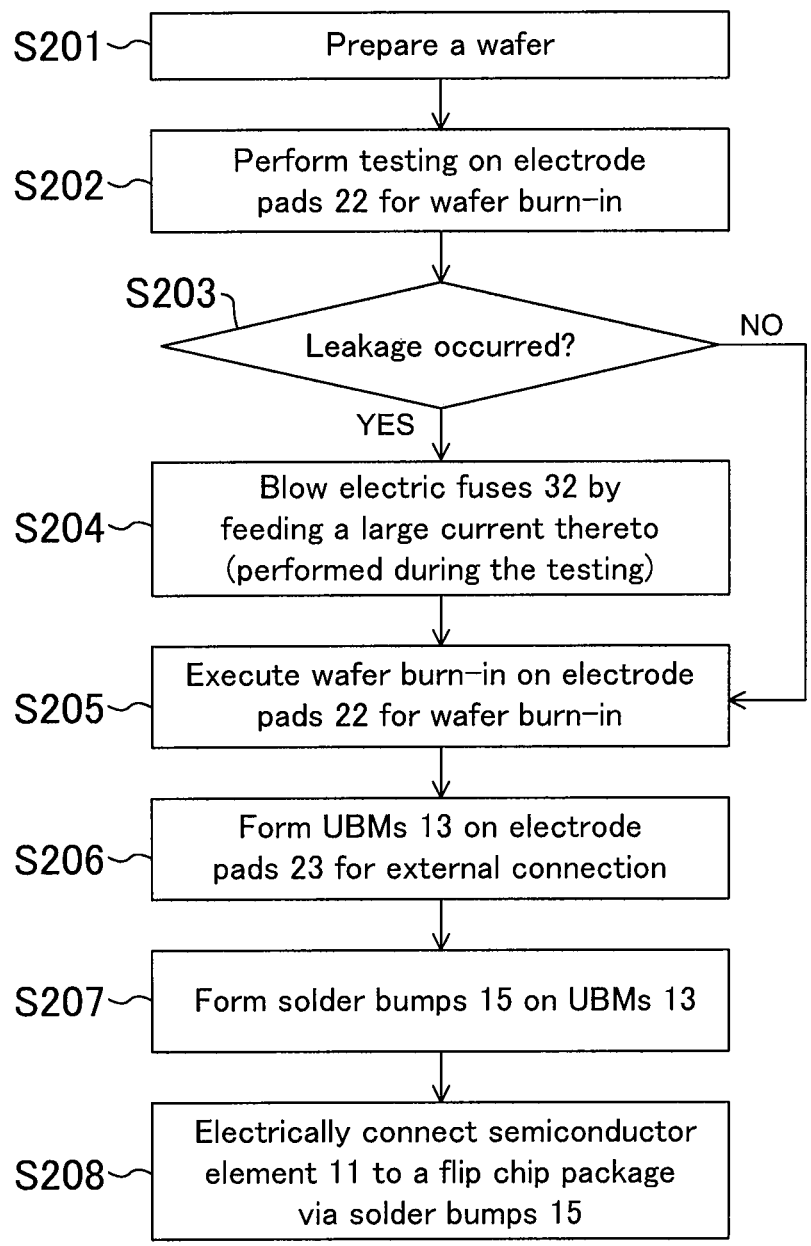

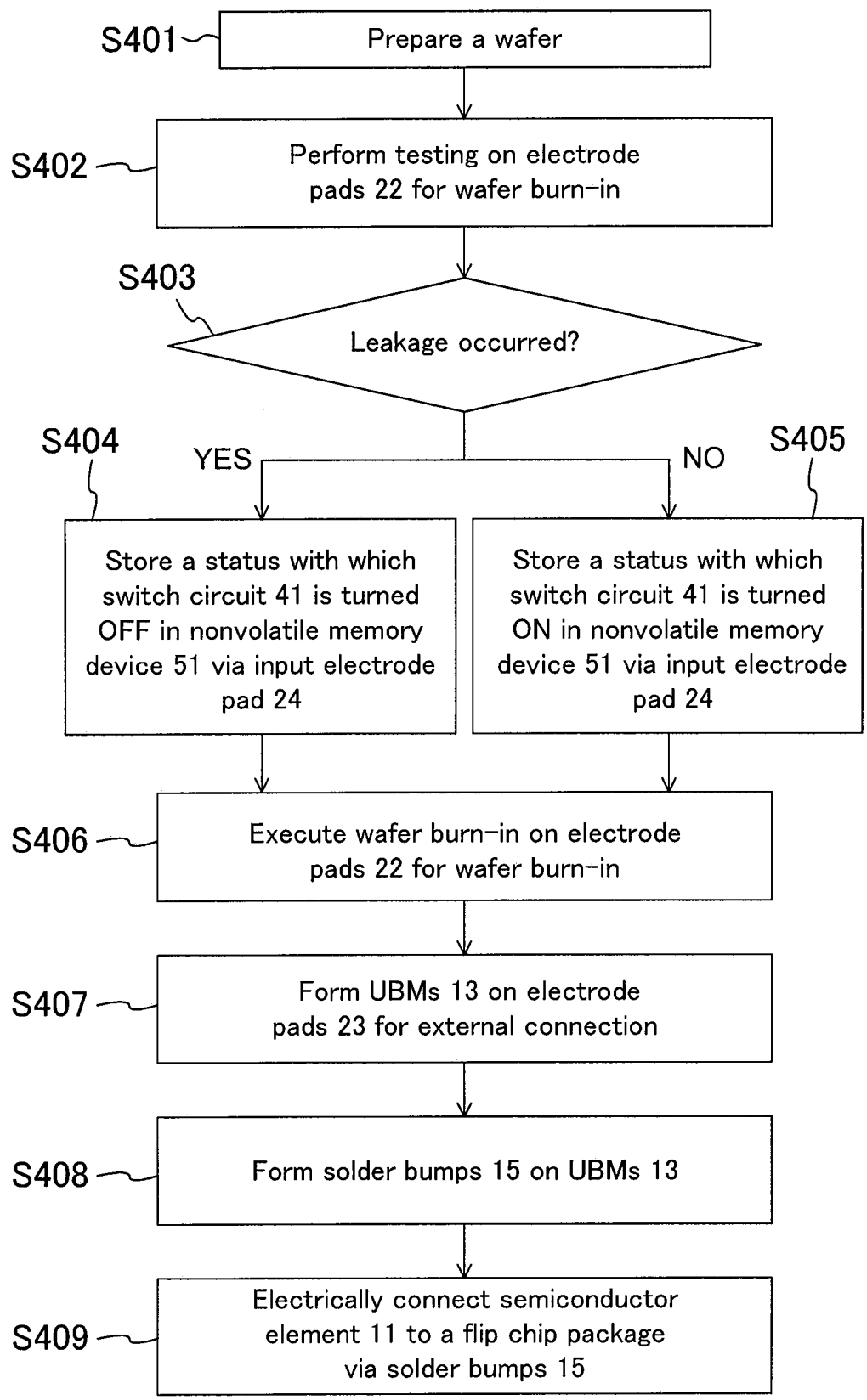

SEMICONDUCTOR DEVICE AND FABRICATION METHOD FOR THE SAME

CROSS-REFERENCE TO RELATED APPLICATION

This is a continuation of PCT International Application PCT/JP2009/002695 filed on Jun. 15, 2009, which claims priority to Japanese Patent Application No. 2008-237914 filed on Sep. 17, 2008 and Japanese Patent Application No. 2008-244856 filed on Sep. 24, 2008. The disclosures of these applications including the specifications, the drawings, and the claims are hereby incorporated by reference in its entirety.

BACKGROUND

The present disclosure relates to a semiconductor device that includes a semiconductor element having an internal circuit and electrode pads, and a fabrication method for the same.

In recent years, with the progress toward a more digitized society, there have been increasing requests for semiconductor devices with higher functions, smaller sizes, and lower cost. For reduction in the cost of semiconductor devices, it is effective to increase the number of semiconductor elements obtained per wafer. Therefore, with miniaturization of semiconductor elements, the element area has been narrowed. With this reduction in element area, along with increase in the number of pins resulting from increase in the number of functions of semiconductor devices, it has become more and more necessary to place electrode pads on semiconductor elements at high density. However, it is difficult to further reduce the size of the electrode pads. If the electrode pads are made smaller, it will be difficult to secure the connectivity of the electrode pads with wire bonds or bumps used in connection between the electrode pads and terminals formed outside the semiconductor element (on a substrate, for example). Smaller electrode pads will also degrade the reliability. Moreover, since the pitch of probe terminals for testing does not change despite the reduction in the size of the electrode pads, testing will be difficult to perform. For the above reasons, flip chip packaging has come to be used increasingly. In the flip chip packaging, electrode pads, used to be formed on the periphery of the principal plane of each semiconductor element, are arranged on the principal plane of the semiconductor element in an area array fashion, and electrically connected to an interposer via bumps made of solder and the like.

To keep up with further cost reduction in semiconductor devices and to remove semiconductor devices faulty in electrical properties and the like at an early stage, wafer burn-in has been introduced. In the wafer burn-in, burn-in is executed, not for respective semiconductor elements after fabrication of semiconductor devices, but for a wafer before fabrication of semiconductor devices at one time. To achieve the wafer burn-in, electrical energy must be applied at one time to electrode pads required for burn-in testing provided for a plurality of semiconductor elements in a semiconductor wafer. For example, in a 300 mm-diameter wafer, a probe card for wafer burn-in will be brought into contact with 70,000 or more electrode pads (electrodes pads required for burn-in testing) at one time. At this testing, if electrical energy is supplied to a semiconductor element faulty in electrical properties, heat may be generated abnormally. With this heat generation, troubles such as the followings may occur: a semiconductor element excellent in electrical properties may become faulty in electrical properties, and the probe card for wafer burn-in may burn. To avoid such troubles, for a semiconductor element whose electrical properties are determined faulty in probe testing performed prior to wafer burn-in, application of electrical energy must be cut off in the wafer burn-in process. For example, electrode pads provided at a semiconductor element faulty in electrical properties, among the semiconductor elements in a semiconductor wafer, are coated with a resin to electrically insulate the electrode pads (see Japanese Patent Publication Nos. P2003-303837, P2005-101439, and P2008-108988).

SUMMARY

FIG. 10A is a top view of a wafer in a first conventional example, and FIG. 10B is a cross-sectional view taken along line XB-XB' in FIG. 10A. The wafer shown in FIGS. 10A and 10B is to be diced into semiconductor elements 111, and a semiconductor device can be obtained by connecting each semiconductor element 111 to a flip chip package. A plurality of semiconductor elements 111, 111, . . . are formed in the semiconductor wafer, and electrode pads 121 are arranged on the principal plane of each semiconductor element 111 in an area array fashion. An under bump metal (UBM) 113 is formed on the top surface of each of the electrode pads 121, and a solder bump (bump made of solder) 115 is formed on the top surface of the UBM 113. Scribe lines 112 run between the adjacent semiconductor elements 111, 111, . . . in the semiconductor wafer, which serve as cutting spacing during dicing of the wafer.

FIG. 11A is a flowchart showing part of a fabrication method for a semiconductor device involving execution of wafer burn-in in the first conventional example, and FIG. 11B is a cross-sectional view illustrating a problem in the first conventional example. As shown in FIG. 11A, the UBMs 113 are formed on the top surfaces of the electrode pads 121 in step S801, and the solder bumps 115 are formed on the top surfaces of the UBMs 113 in step S802. Thereafter, in step S806, wafer burn-in is to be executed on the solder bumps 115. However, to screen and insulate any semiconductor element in which leakage has occurred before execution of the wafer burn-in, testing is performed on the solder bumps 115 in step S803, whether or not leakage has occurred is determined in step S804, and a resin 116 is applied only to the top surfaces of the solder bumps 115 of a semiconductor element in which leakage has occurred in step S805. In this case, however, as shown in FIG. 11B, the resin 116 applied to the top surface of the solder bump 115 may sometimes flow downward along the surface of the solder bump 115 as indicated by arrows 119. Therefore, the top surface of the solder bump 115 of a semiconductor element in which leakage has occurred fails to be completely insulated, causing a problem that the solder bump 115 in question may come into contact with a probe card for wafer burn-in or the like once the wafer burn-in is executed.

To solve the problem described above, a technique of executing wafer burn-in before formation of solder bumps is considered. FIG. 12A is a top view of a wafer in a second conventional example, and FIG. 12B is a cross-sectional view taken along line XIIB-XIIB' in FIG. 12A. The wafer shown in FIGS. 12A and 12B is to be diced into semiconductor elements 111, and a semiconductor device can be obtained by connecting each semiconductor element 111 to a flip chip package. A plurality of semiconductor elements 111, 111, . . . are formed in the semiconductor wafer, and electrode pads 123 for external connection are arranged on the principal plane of each semiconductor element 111 in an area array fashion. A UBM 113 is formed on the top surface of each of the electrode pads 123 for external connection, and a solder bump 115 is formed on the top surface of the UBM 113. Electrode pads 122 for wafer burn-in are arranged at positions closer to the periphery of the principal plane of the semiconductor wafer than the electrode pads 123 for external connection.

FIG. 13 is a flowchart showing part of a fabrication method for a semiconductor device involving execution of wafer burn-in in the second conventional example. In this case, before formation of the UBMs 113 on the top surfaces of the electrode pads 123 for external connection in step S905, testing is performed on the electrode pads 122 for wafer burn-in in step S901, whether or not leakage has occurred is determined in step S902, and a resin 116 is applied to the top surfaces of the electrode pads 122 for wafer burn-in of a semiconductor element 111 in which leakage has occurred in step S903. Thereafter, wafer burn-in is executed on the electrode pads 122 for wafer burn-in in step S904, the UBMs 113 are formed on the top surfaces of the electrode pads 123 for external connection in step S905, and the solder bumps 115 are formed on the top surfaces of the UBMs 113 in step S906. However, in this case, the plating process of forming the UBMs 113 (step S905) is performed under the existence of the resin 116 applied to the surfaces of the electrode pads 122 for wafer burn-in. This may cause a problem of polluting a plating bath or a plating solution with the resin 116.

The above problem is not limited to the semiconductor device of this structure, but may occur in fabrication of a semiconductor device of any structure as long as wafer burn-in is executed before formation of UBMs. In other words, this problem may occur, not only when wafer burn-in is executed before formation of UBMs in a fabrication method for a semiconductor device involving flip chip connection using solder bumps, but also as long as wafer burn-in is executed before formation of UBMs in fabrication of a semiconductor device.

In view of the above problem, according to the present invention, a semiconductor element in which leakage has occurred can be insulated reliably before wafer burn-in without causing pollution of a plating bath or a plating solution.

The semiconductor device of the present invention includes: a semiconductor element having an internal circuit; and an electrode pad provided for the semiconductor element. The electrode pad is electrically connected to the internal circuit via a control portion for controlling electrical connection between the electrode pad and the internal circuit. In such a semiconductor device, the electrode pad and the internal circuit are electrically connected to or insulated from each other with the control portion.

The electrode pad is preferably an electrode pad for wafer burn-in.

The control portion may be a metal fuse blown by laser trimming, or may be an electric fuse blown when a given amount or more of current flows to the electric fuse. When the control portion is an electric fuse, the electrode pad and the internal circuit can be electrically insulated from each other while testing is being performed. The electric fuse is preferably blown when an amount of current flows thereto that exceeds a maximum current amount during wafer burn-in and is below a breakage critical current amount with which a probe card for wafer burn-in or a measurement element for wafer burn-in will be broken. By use of such an electric fuse as the control portion, the number of fabrication process steps for the semiconductor device can be reduced.

The control portion may be a switch circuit. In this case, the switch circuit may be set to an ON or OFF position by a nonvolatile memory device that stores information of setting the switch circuit to the ON or OFF position and sets the switch circuit to the ON or OFF position according to the information.

More specifically, the electrode pad may be electrically connected to a power supply terminal of the internal circuit, and to a terminal among an input terminal, an output terminal, and an input/output terminal of the internal circuit, via the switch circuit.

In a preferred embodiment to be described later, the switch circuit connected to the power supply terminal is a p-type metal oxide semiconductor (MOS) transistor. In a preferred embodiment to be described later, the switch circuit connected to a terminal among the input terminal, the output terminal, and the input/output terminal has a p-type MOS transistor and an n-type MOS transistor whose sources and drains are respectively connected in parallel with each other.

The nonvolatile memory device may be a flash memory or an electric fuse circuit.

Preferably, the semiconductor device further includes an electrode pad for external connection for electrically connecting the internal circuit and the control portion to each other. In this case, the electrode pad is preferably an electrode pad for wafer burn-in, and the electrode pad for wafer burn-in is preferably connected to the internal circuit via the control portion and the electrode pad for external connection. With this configuration, occurrence of problems due to the existence of the control portion can be minimized.

The fabrication method for a semiconductor device of the present invention includes the steps of: (a) preparing a wafer having a semiconductor element formed in each of a plurality of regions separated from each other with a scribe line, the semiconductor element having an internal circuit, an electrode pad, and a control portion electrically connected to the internal circuit and the electrode pad for controlling electrical connection between the internal circuit and the electrode pad; (b) determining whether or not leakage has occurred in the semiconductor element; (c) electrically insulating the internal circuit from the electrode pad with the control portion for a semiconductor element determined that leakage has occurred in the step (b); and (d) executing burn-in for the wafer after the step (c).

By adopting the above method, it is possible to keep a semiconductor element in which leakage has occurred from being subjected to wafer burn-in, and therefore prevent a probe card for wafer burn-in and the like from being broken in a wafer burn-in process. In addition, a semiconductor element in which leakage has occurred can be kept from being subjected to wafer burn-in without the necessity of coating the surface of the electrode pad of such a semiconductor element with a resin.

The semiconductor element may have a fuse as the control portion. In this case, the fuse may be blown in the step (c). Alternatively, the semiconductor element may have a switch circuit as the control portion. In this case, the switch circuit may be turned OFF in the step (c).

When the control section is a switch circuit, the semiconductor element preferably has a nonvolatile memory device that stores information of setting the switch circuit to an ON or OFF position and sets the switch circuit to the ON or OFF position according to the information. In this case, in the step (c), information of setting the switch circuit to the OFF position may be stored in the nonvolatile memory device for a semiconductor element in which leakage has occurred, while information of setting the switch circuit to the ON position may be stored in the nonvolatile memory device for a semiconductor element in which no leakage has occurred.

Preferably, the fabrication method further includes the step of (e) forming a metal layer on the electrode pad after the step (d). In the step (e), an under bump metal is preferably formed on the electrode pad, and preferably the method further includes the step of (f) forming a bump on the under bump metal and electrically connecting the semiconductor element to a flip chip package via the bump.

According to the present invention, a semiconductor element in which leakage has occurred can be insulated before execution of wafer burn-in reliably without causing pollution of a plating bath or a plating solution.

BRIEF DESCRIPTION OF THE DRAWINGS

FIG. 2 is a flowchart showing a fabrication method for the semiconductor device of Embodiment 1 of the present invention.

FIG. 4 is a flowchart showing a fabrication method for the semiconductor device of Embodiment 2 of the present invention.

FIG. 7 is a flowchart showing a fabrication method for the semiconductor device of Embodiment 3 of the present invention.

DETAILED DESCRIPTION

Figure 1A:
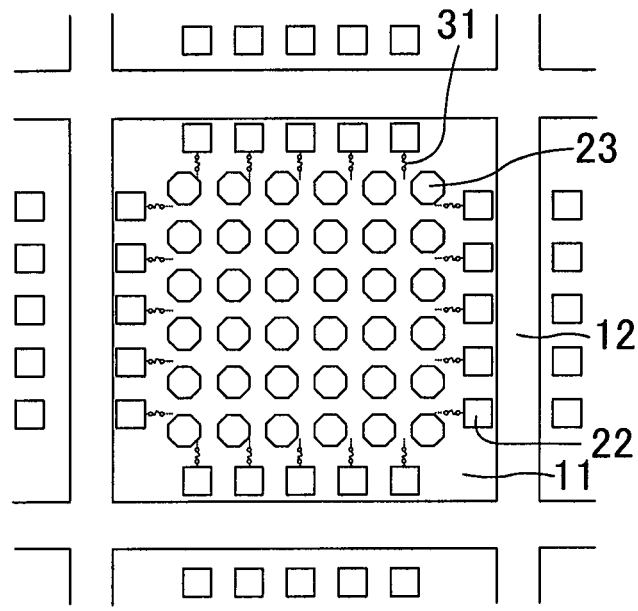
FIG. 1A is a top view of a wafer in Embodiment 1 of the present invention.

Embodiments of the present invention will be described in detail with reference to the accompanying drawings. It is to be noted that the present invention is not limited to the configurations described below. In the following description, the same components are denoted by the same reference numerals, and the description of these components will be omitted in some cases.

Embodiment 1

Figure 12A:
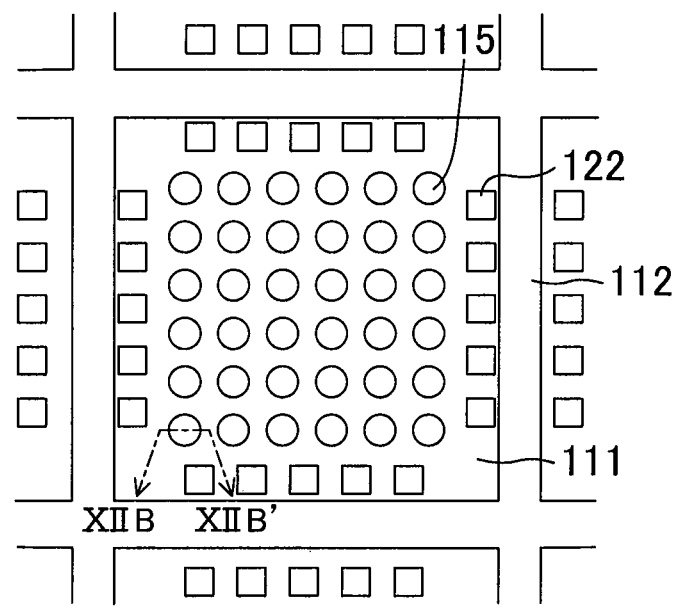
FIG. 12A is a top view of a wafer in a second conventional example.
Figure 12B:
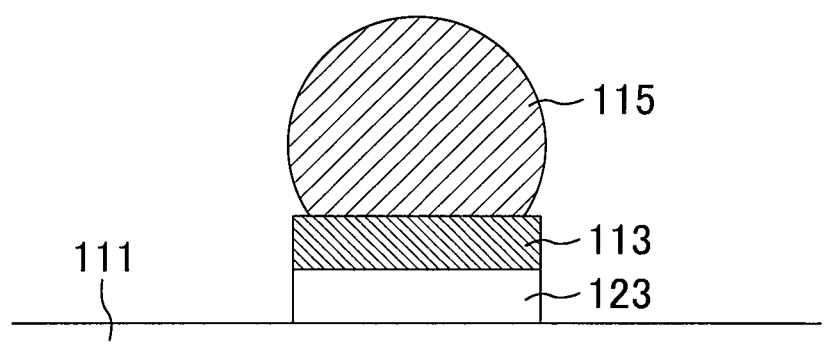
FIG. 12B is a cross-sectional view taken along line XIIB-XIIB' in FIG. 12A.
Figure 13:
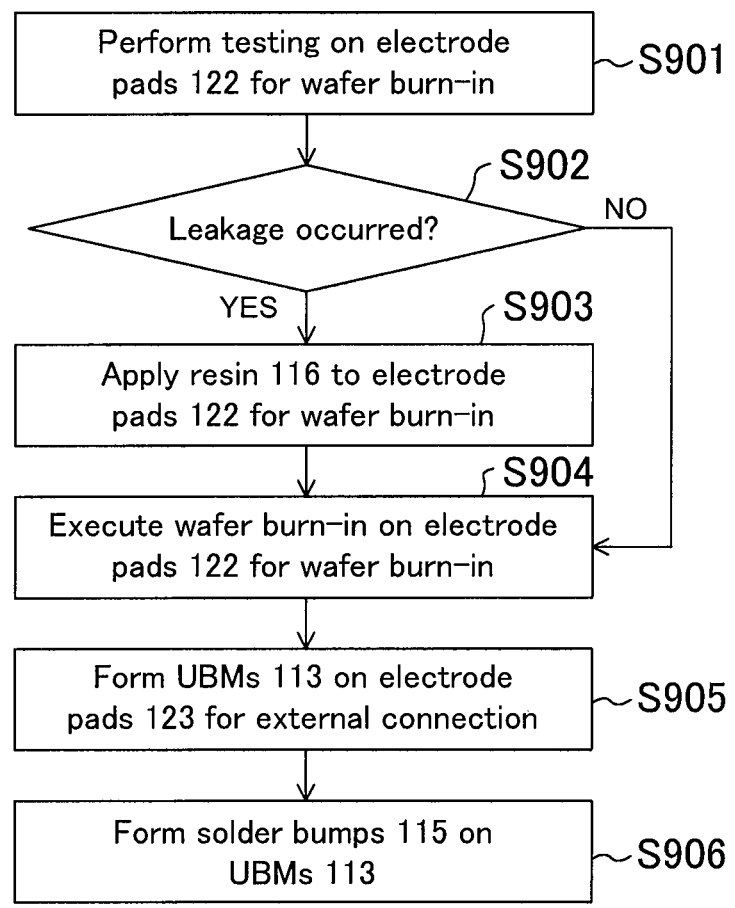
FIG. 13 is a flowchart showing part of a fabrication method for a semiconductor device involving execution of wafer burn-in in the second conventional example.

FIG. 1A is a top view of a wafer in Embodiment 1 of the present invention. A plurality of semiconductor elements 11, 11, . . . are formed in the semiconductor wafer. On the principal plane of each semiconductor element 11, electrode pads 23, 23, . . . for external connection are arranged in an area array fashion. Metal fuses (control portions) 31, 31, . . . are placed at positions closer to the periphery than the electrode pads 23 for external connection, and electrode pads 22 for wafer burn-in are placed at positions closer to the periphery than the metal fuses 31, 31, . . . . Scribe lines 12 run between the adjacent semiconductor elements 11, 11, . . . in the semiconductor wafer, which serve as cutting spacing during dicing of the wafer. Although not shown in FIG. 1A, UBMs 13 and solder bumps 15 are formed sequentially on the top surfaces of the electrode pads 23 for external connection as shown in FIG. 12B. In a semiconductor device of this embodiment, the semiconductor element 11 obtained by dicing the semiconductor wafer shown in FIG. 1A is connected to a flip chip package (not shown) via the solder bumps 15.

Figure 1B:
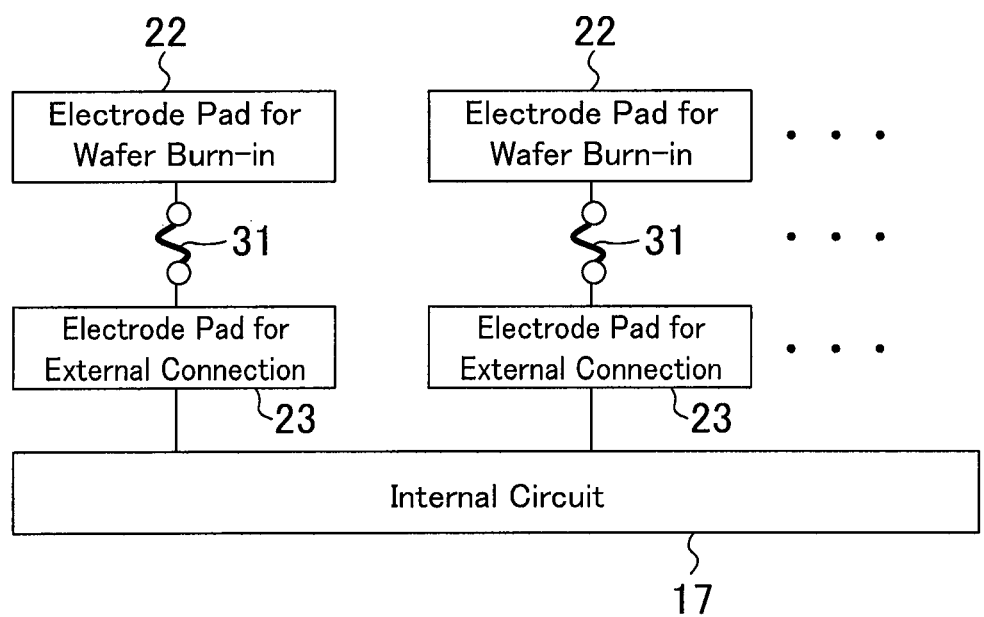
FIG. 1B is a circuit diagram of a semiconductor device of Embodiment 1 of the present invention.

FIG. 1B is a circuit diagram of the semiconductor device of this embodiment. Each of the electrode pads 22 for wafer burn-in is electrically connected to an internal circuit 17 via the corresponding metal fuse 31 and the corresponding electrode pad 23 for external connection. Therefore, once the metal fuse 31 is blown, the electrode pad 22 for wafer burn-in is electrically insulated from the internal circuit 17. Insulation of the electrode pad 22 for wafer burn-in from the internal circuit 17 can be made comparatively easily because the metal fuse 31 is blown by laser trimming and the like.

FIG. 2 is a flowchart showing a fabrication method for the semiconductor device of this embodiment. First, the wafer shown in FIG. 1A is prepared in step S101 (step (a)). Testing is then performed for the electrode pads 22 for wafer burn-in in step S102, and whether or not leakage has occurred is determined in step S103 (step (b)). If leakage has occurred, the location of any semiconductor element in which leakage has occurred in the semiconductor wafer is stored in memory. For a semiconductor element in which leakage has occurred, the metal fuses 31 are blown by laser trimming using a device such as a laser trimmer in step S104. For a semiconductor element in which no leakage has occurred, the step S104 is bypassed and hence the metal fuses 31 are not blown. In this way, while the electrode pads 22 for wafer burn-in are electrically insulated from the internal circuit 17 in a semiconductor element in which leakage has occurred (step (c)), the electrical connection between the electrode pads 22 for wafer burn-in and the internal circuit 17 can be maintained in a semiconductor element in which no leakage has occurred. Thereafter, wafer burn-in is executed on the electrode pads 22 for wafer burn-in in step S105 (step (d)). In this step, no wafer burn-in is executed for a semiconductor element in which leakage has occurred because the electrode pads 22 for wafer burn-in are electrically insulated from the internal circuit 17, while wafer burn-in is executed for a semiconductor element in which no leakage has occurred because the electrical connection between the electrode pads 22 for wafer burn-in and the internal circuit 17 is maintained. Subsequently, the UBMs 13 are formed on the top surfaces of the electrode pads 23 for external connection in step S106 (step (e)), and the solder bumps 15 are formed on the top surfaces of the UBMs 13 in step S107 (step (f). The wafer is then diced to form the semiconductor elements 11, and each semiconductor element 11 is connected to a flip chip package via the solder bumps 15 in step S108 (step (f). In this way, the semiconductor device of this embodiment can be fabricated.

As described above, in this embodiment, for a semiconductor element in which leakage has occurred, the electrode pads 22 for wafer burn-in can be electrically insulated from the internal circuit 17 before execution of wafer burn-in without the necessity of applying a resin to the surfaces of the electrode pads 22 for wafer burn-in. Thus, wafer burn-in can be executed without causing pollution of a plating bath or a plating solution in the plating process of forming UBMs and the like.

In this embodiment, the following configurations may also be adopted. Note that the configurations and effects to follow will also apply in Embodiment 2 and a variation of Embodiment 2 described later.

In this embodiment, the electrode pads 22 for wafer burn-in and the electrode pads 23 for external connection are electrically connected to each other via the metal fuses 31, and the electrode pads 23 for external connection and the internal circuit 17 are electrically connected to each other. However, an effect similar to that obtained in this embodiment will be obtained only if the electrode pads 22 for wafer burn-in and the internal circuit 17 are connected to each other via the metal fuses 31. Alternatively, electrode pads serving as both the electrode pads for wafer burn-in and the electrode pads for external connection may be connected to the internal circuit 17 via the metal fuses 31, to obtain an effect similar to that obtained in this embodiment. It should however be noted that, by providing both the electrode pads 22 for wafer burn-in and the electrode pads 23 for external connection and also providing the metal fuses 31 between the electrode pads 22 and 23, the resultant assembled semiconductor device can perform exchange of signals and exchange with the power supply without the intervention of the metal fuses 31. Thus, the semiconductor device delivered as a product can be prevented from suffering degradation in reliability due to the existence of the metal fuses 31.

In this embodiment, the electrode pads 23 for external connection may not necessarily be electrically connected to the electrode pads 22 for wafer burn-in via the metal fuses 31. In other words, the electrode pads 23 for external connection need only to be connected to electrode terminals, among the electrode terminals of the internal circuit 17, which are unnecessary for wafer burn-in. Also, the metal fuses 31 need only to be connected to electrode pads, among the electrode pads of the semiconductor element 11, which may cause breakage of a probe card for wafer burn-in or a measurement element for wafer burn-in unless being insulated when leakage has occurred.

In this embodiment, metal fuses are taken as an example of control portions for controlling electrical connection between the internal circuit 17 and the electrode pads 22 for wafer burn-in. Alternatively, electric fuses used in Embodiment 2 and its variation to follow, or switch circuits used in Embodiment 3 and its variation to be described later, may be used.

Embodiment 2

Embodiment 2 is different from Embodiment 1 described above in the configuration of fuses. This embodiment will be described with emphasis on points different from Embodiment 1 as follows.

Figure 3A:
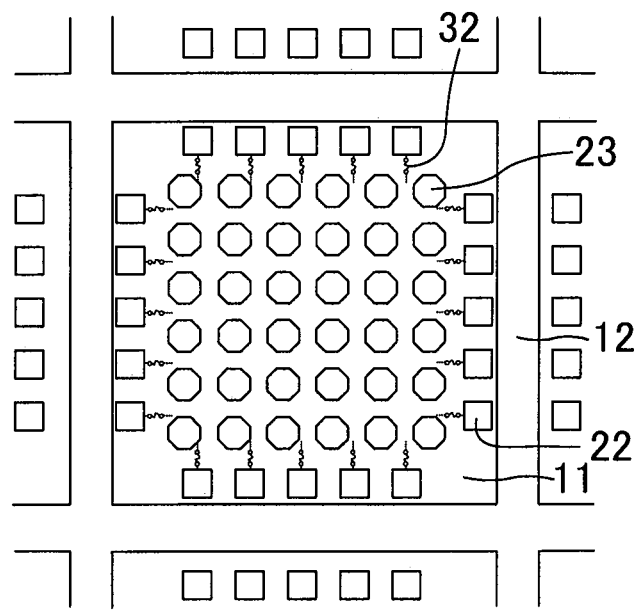
FIG. 3A is a top view of a wafer in Embodiment 2 of the present invention.

FIG. 3A is a top view of a wafer in this embodiment. A plurality of semiconductor elements 11, 11, . . . are formed in the semiconductor wafer. On the principal plane of each semiconductor element 11, electrode pads 23 for external connection are arranged in an area array fashion. Electric fuses (control portions) 32 are placed at positions closer to the periphery than the electrode pads 23 for external connection, and electrode pads 22 for wafer burn-in are placed at positions closer to the periphery than the electric fuses 32. Thus, in this embodiment, the electrode pads 22 for wafer burn-in are electrically connected to the internal circuit 17 via the electric fuse 32, not metal fuses.

Figure 3B:
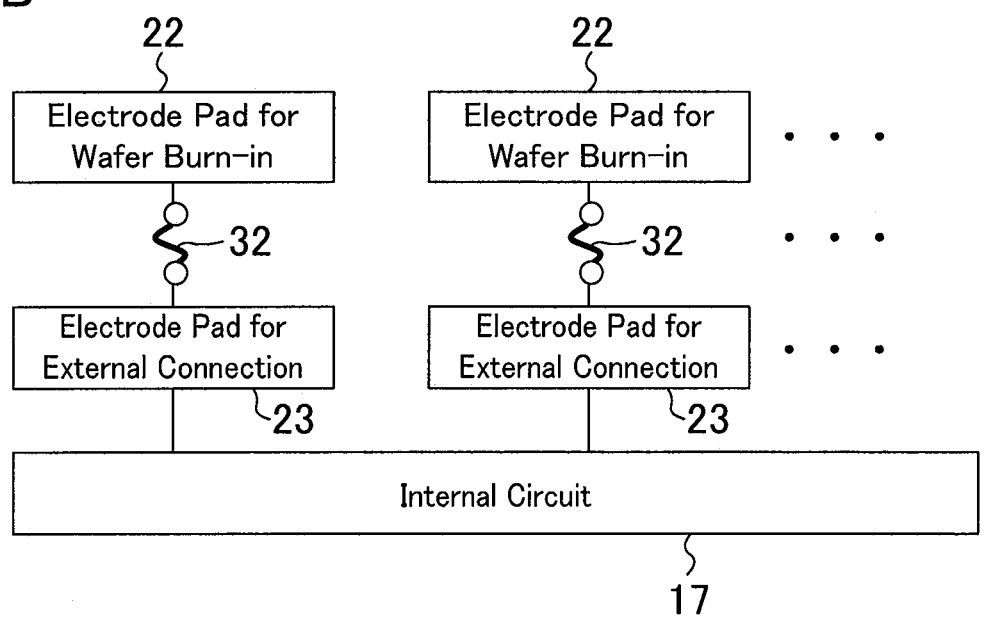
FIG. 3B is a circuit diagram of a semiconductor device of Embodiment 2 of the present invention.

FIG. 3B is a circuit diagram of the semiconductor device of this embodiment. Each of the electrode pads 22 for wafer burn-in is electrically connected to the internal circuit 17 via the corresponding electric fuse 32 and the corresponding electrode pad 23 for external connection. Therefore, once the electric fuse 32 is blown, the electrode pad 22 for wafer burn-in is electrically insulated from the internal circuit 17. Insulation of the electrode pad 22 for wafer burn-in from the internal circuit 17 can be made comparatively easily because the electric fuse 32 is blown once a large current flows thereto.

FIG. 4 is a flowchart showing a fabrication method for the semiconductor device of this embodiment. First, the wafer shown in FIG. 3A is prepared in step S201 (step (a)). Testing is then performed for the electrode pads 22 for wafer burn-in in step S202, and whether or not leakage has occurred is determined in step S203 (step (b)). Locations of semiconductor elements in which leakage have occurred in the semiconductor wafer are stored in memory. For a semiconductor element in which leakage has occurred, the electric fuses 32 are blown by feeding a large current to the electric fuses 32 in step S204. For a semiconductor element in which no leakage has occurred, the step S204 is bypassed and hence the electric fuses 32 are not blown. In this way, while the electrode pads 22 for wafer burn-in are electrically insulated from the internal circuit 17 in a semiconductor element in which leakage has occurred (step (c)), the electrical connection between the electrode pads 22 for wafer burn-in and the internal circuit 17 can be maintained in a semiconductor element in which no leakage has occurred. Thereafter, wafer burn-in is executed on the electrode pads 22 for wafer burn-in in step S205 (step (d)). In this step, no wafer burn-in is executed for a semiconductor element in which leakage has occurred because the electrode pads 22 for wafer burn-in are electrically insulated from the internal circuit 17, while wafer burn-in is executed for a semiconductor element in which no leakage has occurred because the electrical connection between the electrode pads 22 for wafer burn-in and the internal circuit 17 is maintained. Subsequently, the UBMs 13 are formed on the top surfaces of the electrode pads 23 for external connection in step S206 (step (e)), and the solder bumps 15 are formed on the top surfaces of the UBMs 13 in step S207 (step (f). The wafer is then diced to form the semiconductor elements 11, and each semiconductor element 11 is connected to a flip chip package via the solder bumps 15 in step S208 (step (f)). In this way, the semiconductor device of this embodiment can be fabricated.

As described above, in this embodiment, the same effect as that obtained in Embodiment 1 described above can be obtained.

Moreover, in this embodiment, in which the electric fuses 32 are blown by feeding a large current to the electric fuses 32, blowing of the electric fuses 32 of a semiconductor element in which leakage has occurred can be made while the testing is being performed. Therefore, since it is unnecessary to provide a device dedicated to blowing of the electric fuses 32, unlike Embodiment 1 described above, the semiconductor device can be fabricated at low cost. Also, the turnaround time (TAT) can be shortened in the fabrication of the semiconductor device.

The electric fuses 32 in this embodiment may have a property described in a variation of this embodiment below.

Variation of Embodiment 2

Figure 5A:
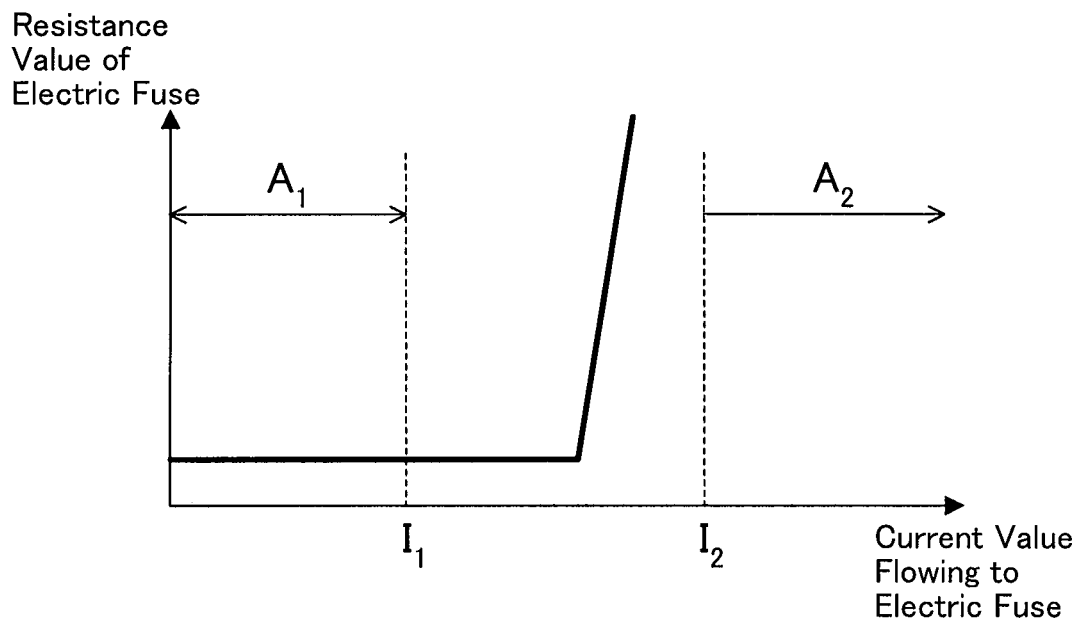
FIG. 5A is a graph illustrating properties of an electric fuse in a variation of Embodiment 2 of the present invention.

FIG. 5A is a graph illustrating a property of electric fuses in a variation of Embodiment 2. The electric fuses in this variation have the property shown in FIG. 5A. In FIG. 5A, the x-axis represents the current value flowing to an electric fuse and the y-axis represents the resistance value of the electric fuse. In FIG. 5A, also, "$A_1$" denotes a range of current value where wafer burn-in is executed and "$A_2$" denotes a range of current value where a probe card for wafer burn-in or a measurement element for wafer burn-in will be broken. An electric fuse generally has the following property: it is blown with a given amount or more of current flowing thereto, and its resistance value increases once it is blown finally to reach the insulating state. The current value required to blow the electric fuses can be adjusted by changing the shape of the fuses, such as the thickness and length of the fuses, the material of the fuses, and the number of fuses connected in parallel. Specifically, the electric fuses in this variation are designed to blow with an amount of current flowing thereto that exceeds the maximum current amount $I_1$ during wafer burn-in and is below the breakage critical current amount $I_2$ with which the probe card for wafer burn-in or the measurement element for wafer burn-in will be broken. Accordingly, in fabrication of the semiconductor device of this variation, it is unnecessary to take the trouble of feeding a large current for blowing electric fuses because a large current will flow to a position where leakage has occurred and hence blow electric fuses.

Figure 5B:
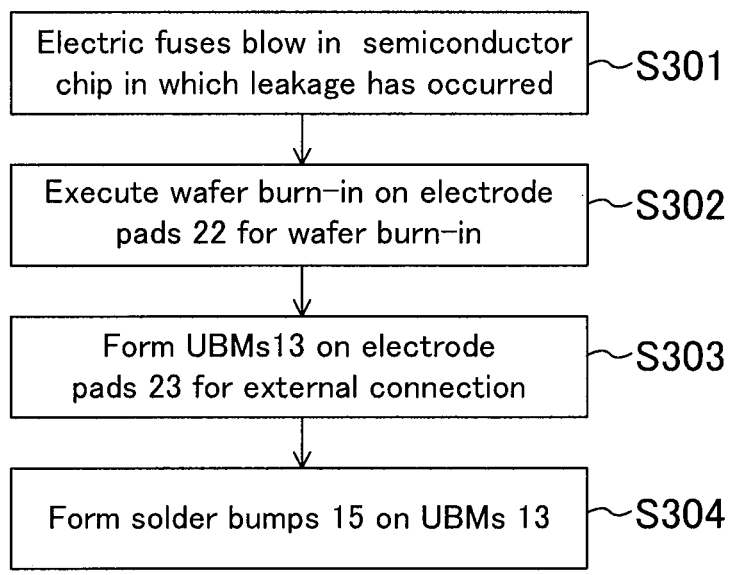
FIG. 5B is a flowchart showing part of a fabrication method for a semiconductor device of the variation of Embodiment 2 of the present invention.

FIG. 5B is a flowchart showing part of a fabrication method for the semiconductor device of this variation. By adopting the electric fuses having the property shown in FIG. 5A as the control portions, it is possible to omit the step of performing testing on the electrode pads 22 for wafer burn-in, the step of determining whether or not leakage has occurred, and the step of blowing the electric fuses of a semiconductor element in which leakage has occurred. Specifically, as shown in FIG. 5B, the electric fuses of a semiconductor element in which leakage has occurred blow in step S301 because a large current flows to a position where leakage has occurred. In this way, in a semiconductor element in which leakage has occurred, the electrode pads 22 for wafer burn-in are electrically insulated from the internal circuit 17. Thereafter, wafer burn-in is executed on the electrode pads 22 for wafer burn-in in step S302. In this step, no wafer burn-in is executed for a semiconductor element in which leakage has occurred because the electrode pads 22 for wafer burn-in are electrically insulated from the internal circuit 17. Subsequently, the UBMs 13 are formed on the top surfaces of the electrode pads 23 for external connection in step S303, and the solder bumps 15 are formed on the top surfaces of the UBMs 13 in step S304.

As described above, in this variation, in which the number of fabrication process steps for the semiconductor device can be reduced compared with Embodiment 2 described above, the semiconductor device can be fabricated in a shorter time.

Embodiment 3

In Embodiment 1, Embodiment 2, and the variation of Embodiment 2 described above, the metal fuses or the electric fuses are used as the control portions. In Embodiment 3 and a variation thereof, switch circuits are used as the control portions, which will be described concretely as follows.

Figure 6A:
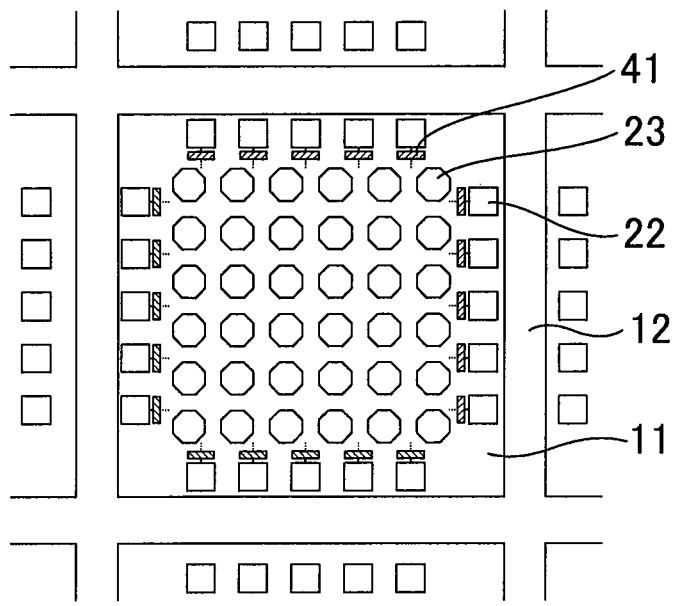
FIG. 6A is a top view of a wafer in Embodiment 3 of the present invention.

FIG. 6A is a top view of a wafer in Embodiment 3 of the present invention. A plurality of semiconductor elements 11, 11, . . . are formed in the semiconductor wafer. On the principal plane of each semiconductor element 11, electrode pads 23 for external connection are arranged in an area array fashion. Switch circuits (control portions) 41 are placed at positions closer to the periphery than the electrode pads 23 for external connection, and electrode pads 22 for wafer burn-in are placed at positions closer to the periphery than the switch circuits 41.

Figure 6B:
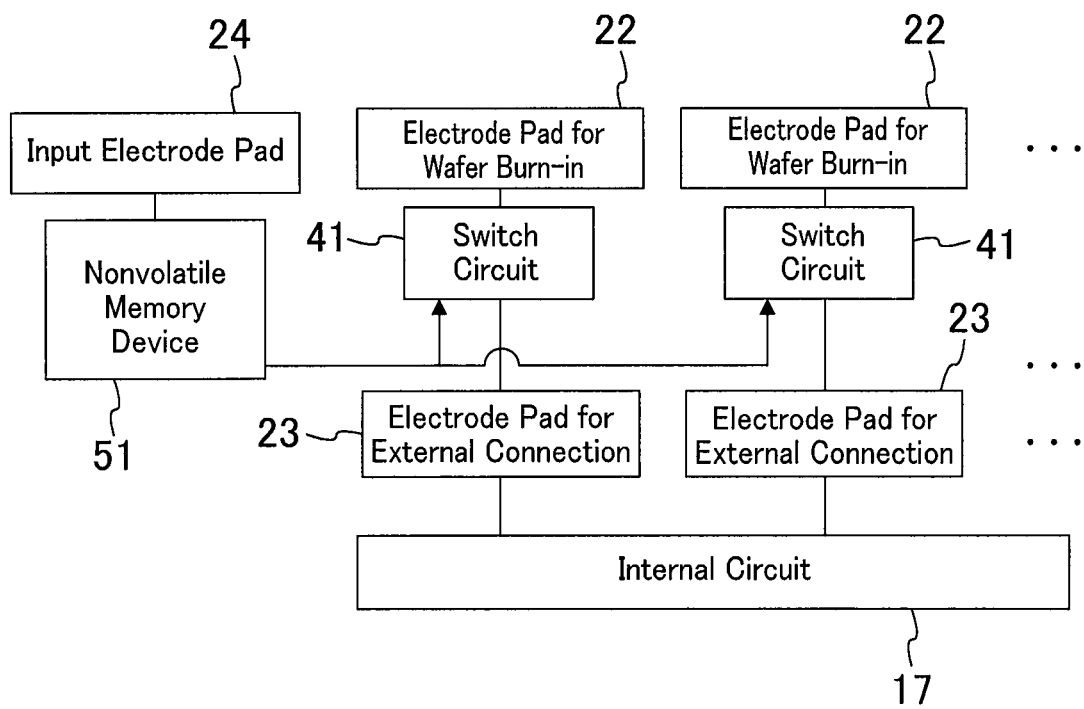
FIG. 6B is a circuit diagram of a semiconductor device of Embodiment 3 of the present invention.

FIG. 6B is a circuit diagram of the semiconductor device of this embodiment. Each of the electrode pads 22 for wafer burn-in is electrically connected to the internal circuit 17 via the corresponding switch circuit 41 and the corresponding electrode pad 23 for external connection. Therefore, once the switch circuit 41 is turned OFF, the electrode pad 22 for wafer burn-in is electrically insulated from the internal circuit 17. A nonvolatile memory device 51 is connected to the switch circuits 41, to control ON/OFF of the switch circuits 41. More specifically, the nonvolatile memory device 51 sets the switch circuits 41 to the ON position when storing information of setting the switch circuits 41 to the ON position, and sets the switch circuits 41 to the OFF position when storing information of setting the switch circuits 41 to the OFF position. The information of setting the switch circuits 41 to the ON or OFF position is input into the nonvolatile memory device 51 via an input electrode pad 24 for the nonvolatile memory device 51.

FIG. 7 is a flowchart showing a fabrication method for the semiconductor device of this embodiment. First, the wafer shown in FIG. 6A is prepared in step S401 (step (a)). Testing is then performed for the electrode pads 22 for wafer burn-in in step S402, and whether or not leakage has occurred is determined in step S403 (step (b)). For a semiconductor element in which leakage has occurred, information of setting the switch circuits 41 to the OFF position is input into the nonvolatile memory device 51 via the input electrode pad 24 (step S404). The nonvolatile memory device 51 then stores the information of setting the switch circuits 41 to the OFF position and turns OFF the switch circuits 41. In this way, in a semiconductor element in which leakage has occurred, the electrode pads 22 for wafer burn-in are electrically insulated from the internal circuit 17 (step (c)). For a semiconductor element in which no leakage has occurred, information of setting the switch circuits 41 to the ON position is input into the nonvolatile memory device 51 via the input electrode pad 24 (step S405). The nonvolatile memory device 51 then stores the information of setting the switch circuits 41 to the ON position and turns ON the switch circuits 41. In this way, in a semiconductor element in which no leakage has occurred, the electrode pads 22 for wafer burn-in are electrically connected to the internal circuit 17. Thereafter, wafer burn-in is executed for the electrode pads 22 for wafer burn-in in step S406 (step (d)). In this step, no wafer burn-in is executed for a semiconductor element in which leakage has occurred because the electrode pads 22 for wafer burn-in are electrically insulated from the internal circuit 17, while wafer burn-in is executed for a semiconductor element in which no leakage has occurred because the electrode pads 22 for wafer burn-in are electrically connected to the internal circuit 17. Subsequently, the UBMs 13 are formed on the top surfaces of the electrode pads 23 for external connection in step S407 (step (e)), and the solder bumps 15 are formed on the top surfaces of the UBMs 13 in step S408 (step (f). The wafer is then diced to form the semiconductor elements 11, and each semiconductor element 11 is connected to a flip chip package via the solder bumps 15 in step S409 (step (f)). In this way, the semiconductor device of this embodiment can be fabricated.

As described above, in this embodiment, the same effect as that obtained in Embodiment 1 described above can be obtained.

In this embodiment, the following configurations may also be adopted. Note that the configurations and effects to follow will also apply in a variation of Embodiment 3 described later.

In this embodiment, the electrode pads 22 for wafer burn-in and the electrode pads 23 for external connection are electrically connected to each other via the switch circuits 41, and the electrode pads 23 for external connection and the internal circuit 17 are electrically connected to each other. However, an effect similar to that obtained in this embodiment will be obtained only if the electrode pads 22 for wafer burn-in and the internal circuit 17 are connected to each other via the switch circuits 41. Alternatively, electrode pads serving as both the electrode pads for wafer burn-in and the electrode pads for external connection may be connected to the internal circuit 17 via the switch circuits 41, to obtain an effect similar to that obtained in this embodiment. It should however be noted that, by providing both the electrode pads 22 for wafer burn-in and the electrode pads 23 for external connection and also providing the switch circuits 41 between the electrode pads 22 and 23, the resultant assembled semiconductor device can perform exchange of signals and exchange with the power supply with no intervention of the switch circuits 41. Thus, the semiconductor device delivered as a product can be prevented from suffering degradation in reliability due to the existence of the switch circuits 41.

In this embodiment, the electrode pads 23 for external connection may not necessarily be electrically connected to the electrode pads 22 for wafer burn-in via the switch circuits 41. In other words, only the electrode pads 23 for external connection may just be connected to electrode terminals, among the electrode terminals of the internal circuit 17, which are unnecessary for wafer burn-in. Also, the switch circuits 41 may just be connected to only electrode pads, among the electrode pads of the semiconductor element 11, which may cause breakage of a probe card for wafer burn-in or a measurement element for wafer burn-in unless being insulated when leakage has occurred.

The nonvolatile memory device 51 may be a flash memory, or may be an electric fuse circuit that stores information of setting the switch circuits 41 to the ON or OFF position depending on whether or not a fuse has been blown.

As the switch circuits, ones described in a variation of this embodiment below may be adopted.

Variation of Embodiment 3

Figure 8:
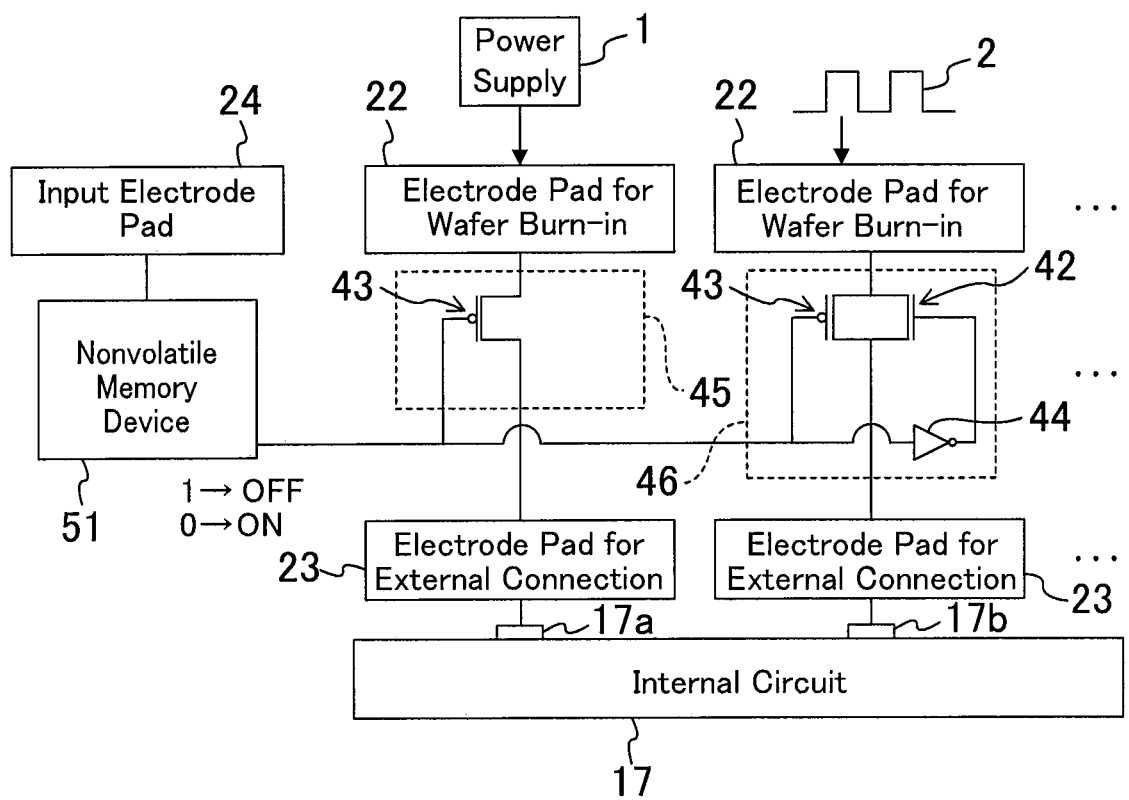
FIG. 8 is a circuit diagram of a semiconductor device of a variation of Embodiment 3 of the present invention.

FIG. 8 is a circuit diagram of a semiconductor device of a variation of Embodiment 3 of the present invention. In this variation, a power supply switch circuit 45 constructed of a p-type MOS transistor 43 is connected to an electrode terminal 17a of the internal circuit 17, and an input/output switch circuit 46 is connected to an input/output terminal 17b of the internal circuit 17. The input/output switch circuit 46 includes an n-type MOS transistor 42, a p-type MOS transistor 43, and an inverter 44. The sources and drains of the n-type MOS transistor 42 and the p-type MOS transistor 43 are respectively connected in parallel with each other. The inverter 44 is connected to the gate of the n-type MOS transistor 42. In the input/output switch circuit 46 configured as described above, while a signal from the nonvolatile memory device 51 is input into the gate of the p-type MOS transistor 43 without being inverted, it is input into the gate of the n-type MOS transistor 42 after being inverted by the inverter 44.

Electrical energy from a power supply 1 is supplied to the electrode terminal 17a of the internal circuit 17. A signal 2 is input into the input/output terminal 17b of the internal circuit 17, or a signal is output from the input/output terminal 17b of the internal circuit 17.

In the semiconductor device of this variation, the nonvolatile memory device 51 stores a signal "1" or "0" received via the input electrode pad 24. When storing the signal "1", the nonvolatile memory device 51 turns OFF the power supply switch circuit 45 and the input/output switch circuit 46, whereby the electrode pads 22 for wafer burn-in are electrically insulated from the internal circuit 17. When storing the signal "0", the nonvolatile memory device 51 turns ON the power supply switch circuit 45 and the input/output switch circuit 46, whereby the electrode pads 22 for wafer burn-in are electrically connected to the internal circuit 17.

By adopting the power supply switch circuit 45 constructed of the p-type MOS transistor 43 as the switch circuit for the electrode terminal 17a of the internal circuit 17, voltage drop can be reduced compared with the case of adopting a power supply switch circuit constructed of an n-type MOS transistor as the switch circuit for the electrode terminal 17a of the internal circuit 17.

By adopting the input/output switch circuit 46 as the switch circuit for the input/output terminal 17b of the internal circuit 17, ON/OFF of the input/output switch circuit 46 can be controlled precisely based on the signal from the nonvolatile memory device 51 even when the ON signal and the OFF signal are alternately input into the input/output switch circuit 46 or when the signal input into the input/output switch circuit 46 changes from ON to OFF or from OFF to ON. Note that the input/output terminal 17b may be an input terminal or an output terminal.

Figure 9:
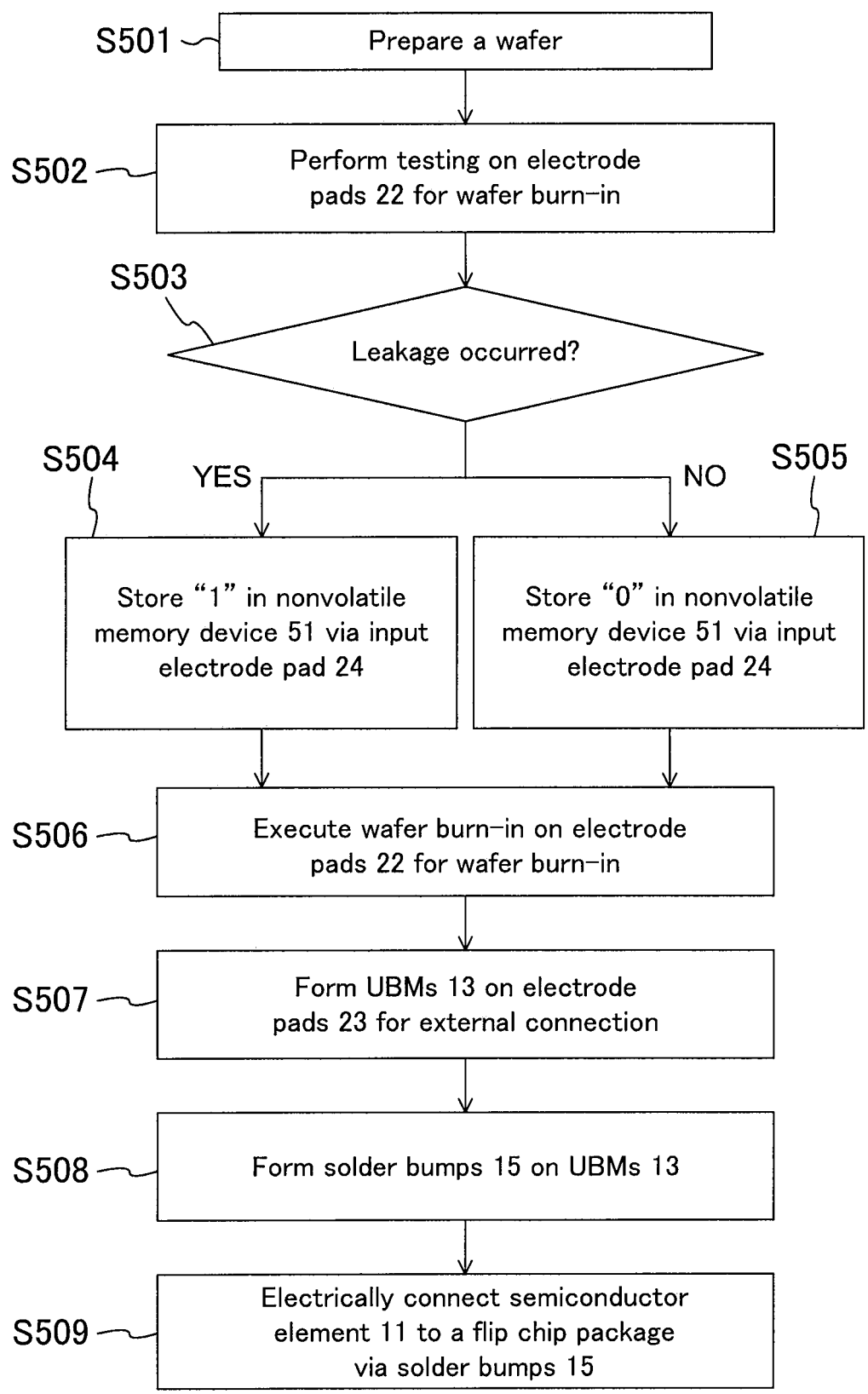
FIG. 9 is a flowchart showing a fabrication method for the semiconductor device of the variation of Embodiment 3 of the present invention.
Figure 10A:
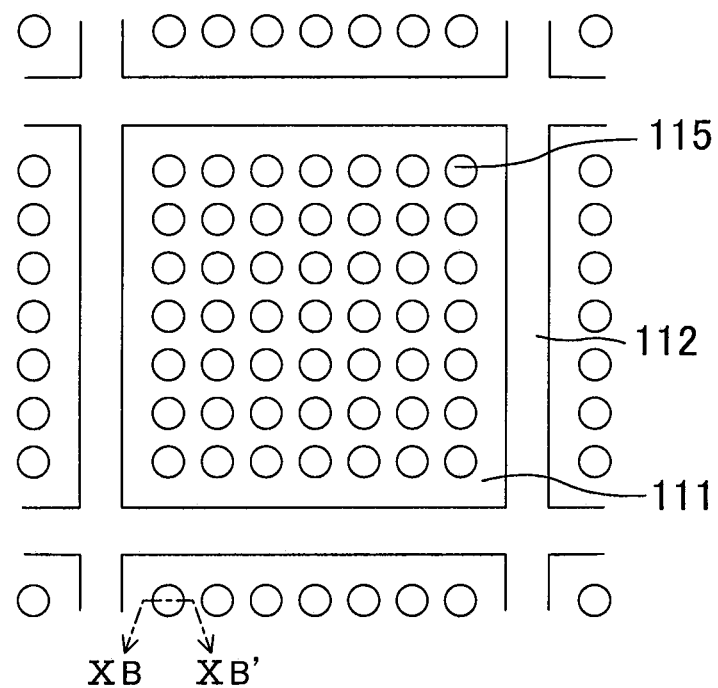
FIG. 10A is a top view of a wafer in a first conventional example.
Figure 10B:
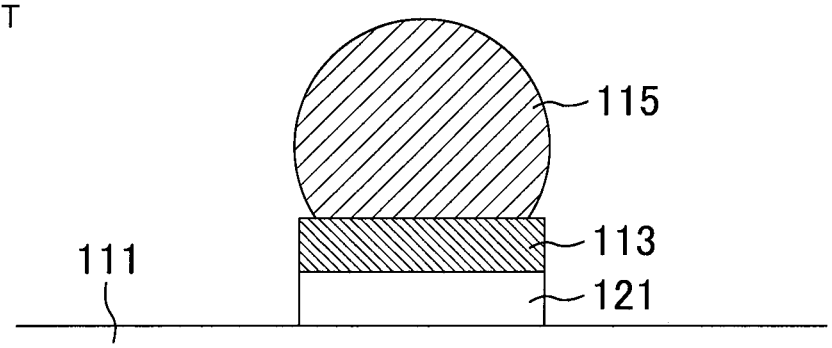
FIG. 10B is a cross-sectional view taken along line XB-XB' in FIG. 10A.
Figure 11A:
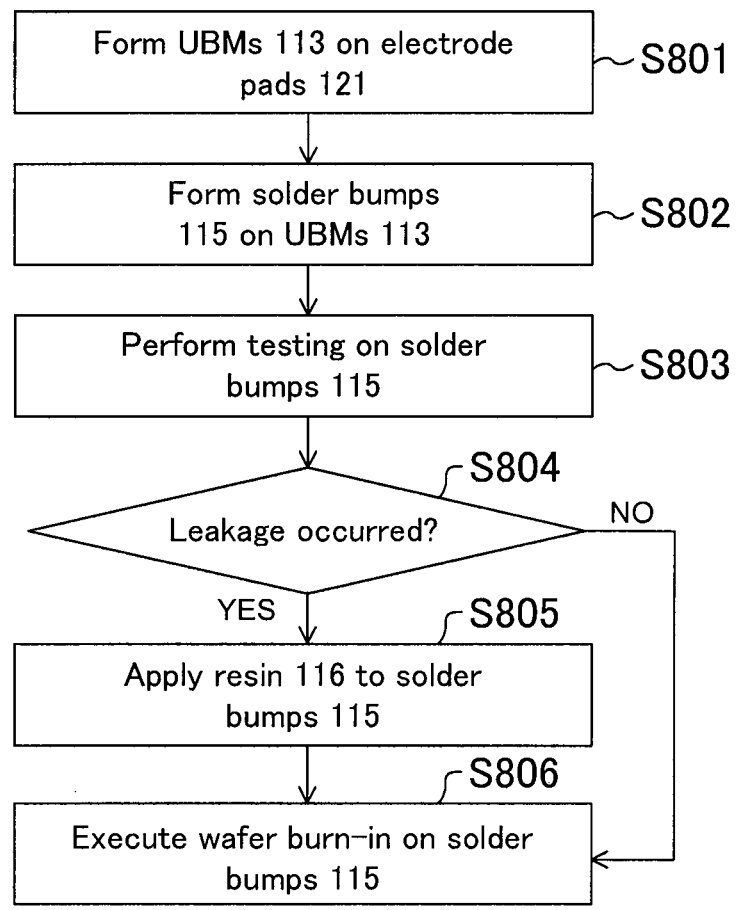
FIG. 11A is a flowchart showing part of a fabrication method for a semiconductor device involving execution of wafer burn-in in the first conventional example.
Figure 11B:
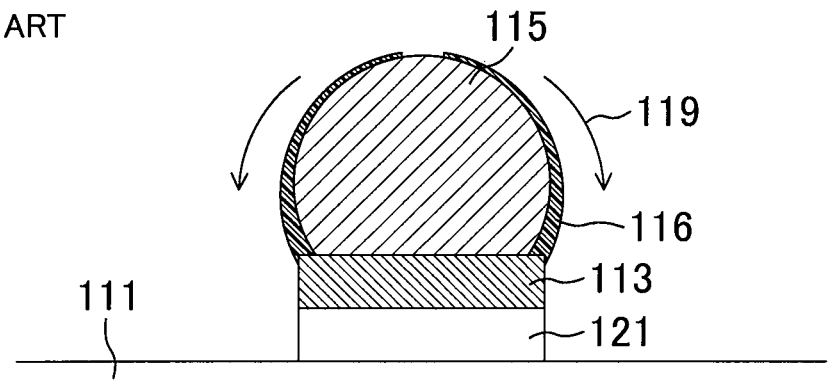
FIG. 11B is a cross-sectional view showing a problem in the first conventional example.

FIG. 9 is a flowchart showing a fabrication method for the semiconductor device of this variation. First, a wafer in this variation is prepared in step S501 (step (a)). Testing is then performed for the electrode pads 22 for wafer burn-in in step S502, and whether or not leakage has occurred is determined in step S503 (step (b)). For a semiconductor element in which leakage has occurred, a signal "1" is input into the nonvolatile memory device 51 via the input electrode pad 24 (step S504). The nonvolatile memory device 51 then stores the signal "1" and turns OFF the power supply switch circuit 45 and the input/output switch circuit 46. For a semiconductor element in which no leakage has occurred, a signal "0" is input into the nonvolatile memory device 51 via the input electrode pad 24 (step S505). The nonvolatile memory device 51 then stores the signal "0" and turns ON the power supply switch circuit 45 and the input/output switch circuit 46. Thereafter, wafer burn-in is executed for the electrode pads 22 for wafer burn-in in step S506. In this step, no wafer burn-in is executed for a semiconductor element in which leakage has occurred because the electrode pads 22 for wafer burn-in are electrically insulated from the internal circuit 17, while wafer burn-in is executed for a semiconductor element in which no leakage has occurred because the electrode pads 22 for wafer burn-in are electrically connected to the internal circuit 17. Subsequently, the UBMs 13 are formed on the top surfaces of the electrode pads 23 for external connection in step S507 (step (e)), and the solder bumps 15 are formed on the top surfaces of the UBMs 13 in step S508 (step (f). The wafer is then diced to form the semiconductor elements 11, and each semiconductor element 11 is connected to a flip chip package via the solder bumps 15 in step S509 (step (f). In this way, the semiconductor device of this variation can be fabricated.

As described above, in this variation, the same effect as that obtained in Embodiment 1 described above can be obtained.

Other Embodiments

Embodiments 1, 2, and 3 and the variations of Embodiments 2 and 3 may otherwise be configured as follows.

The present invention has been described featuring the specific semiconductor device in which the semiconductor element 11 having the UBMs 13 and the solder bumps 15 sequentially formed on the top surfaces of the electrode pads 23 for external connection arranged in an area array fashion is connected to the flip chip package. However, semiconductor devices having other configurations will be able to obtain an effect similar to that described in Embodiment 1 and the like as long as wafer burn-in is executed before a plating process in their fabrication methods.

Testing may be performed after wafer burn-in.

The arrangement of the electrode pads 22 for wafer burn-in and the electrode pads 23 for external connection is not limited to that described above.

As described above, the present invention is useful for a semiconductor device in which wafer burn-in is executed before a plating process and a fabrication method for such a semiconductor device.

What is claimed is:

1. A semiconductor device, comprising:
   a semiconductor element having an internal circuit;
   a switch circuit in the semiconductor element, the switch circuit comprises a first switch circuit and a second switch circuit;
   a first electrode pad for wafer burn-in in the semiconductor element, the first electrode pad for wafer burn-in electrically disconnected from the internal circuit via the first switch circuit;
   a second electrode pad for wafer burn-in in the semiconductor element, the second electrode pad for wafer burn-in electrically connected to the internal circuit via the second switch circuit; and
   a third electrode pad for external connection, the second switch circuit electrically connected to the internal circuit via the third electrode pad for external connection,
   wherein the switch circuit is set to an ON or OFF position by a nonvolatile memory device that stores information of setting the switch circuit to the ON or OFF position and sets the switch circuit to the ON or OFF position according to the information.

2. The semiconductor device of claim 1, wherein
   the second electrode pad for wafer-burn-in is electrically connected to a power supply terminal of the internal circuit, and to a terminal among an input terminal, an output terminal, and an input/output terminal of the internal circuit, via the switch circuit.

3. The semiconductor device of claim 2, wherein the switch circuit connected to the power supply terminal is a p-type MOS transistor.

4. The semiconductor device of claim 2, wherein
   the switch circuit connected to a terminal among the input terminal,
   the output terminal, and the input/output terminal has a p-type MOS transistor and an n-type MOS transistor whose sources and drains are respectively connected in parallel with each other.

5. The semiconductor device of claim 1, wherein the nonvolatile memory device is a flash memory.

6. The semiconductor device of claim 1, wherein the first electrode pad and the second electrode pad for wafer-burn-in are not in contact with a resin.

7. The semiconductor device of claim 1, wherein
   the first electrode pad for wafer burn-in is connected to the switch circuit which is set to the OFF position, and
   the second electrode pad for wafer burn-in is connected to the switch circuit which is set to the ON position.

8. The semiconductor device of claim 1, further comprising:
   a fourth electrode pad for external connection, the first switch circuit connected to the internal circuit via the fourth electrode pad for external connection.

* * * * *